US011892488B2

(12) United States Patent
Abeywickrama

(10) Patent No.: US 11,892,488 B2
(45) Date of Patent: Feb. 6, 2024

(54) RELATIVE BUSHING PARAMETER METHOD TO AVOID TEMPERATURE INFLUENCE IN TRANSFORMER ABSOLUTE BUSHING PARAMETER MONITORING

(71) Applicant: HITACHI ENERGY LTD, Zürich (CH)

(72) Inventor: Nilanga Abeywickrama, Västerås (SE)

(73) Assignee: HITACHI ENERGY LTD, Zürich (CH)

( * ) Notice: Subject to any disclaimer, the term of this patent is extended or adjusted under 35 U.S.C. 154(b) by 321 days.

(21) Appl. No.: 17/292,201

(22) PCT Filed: Oct. 2, 2019

(86) PCT No.: PCT/EP2019/076746
§ 371 (c)(1),
(2) Date: May 7, 2021

(87) PCT Pub. No.: WO2020/094303
PCT Pub. Date: May 14, 2020

(65) Prior Publication Data
US 2021/0389358 A1    Dec. 16, 2021

(30) Foreign Application Priority Data
Nov. 8, 2018  (EP) .................................. 18205173

(51) Int. Cl.
*G01R 27/26*    (2006.01)
*G01R 31/62*    (2020.01)

(52) U.S. Cl.
CPC ..... *G01R 27/2605* (2013.01); *G01R 27/2694* (2013.01); *G01R 31/62* (2020.01)

(58) Field of Classification Search
CPC ................... G01R 27/2605; G01R 27/2694; G01R 31/62; G01R 31/1245; G01R 27/2617
(Continued)

(56) References Cited

U.S. PATENT DOCUMENTS

| 4,757,263 A | 7/1988 | Cummings, III et al. |
| 6,177,803 B1 | 1/2001 | Train et al. |

(Continued)

FOREIGN PATENT DOCUMENTS

| CN | 104502762 | 4/2015 |
| CN | 106030738 | 10/2016 |

(Continued)

OTHER PUBLICATIONS

Office Action, Chinese Patent Application No. 201980073656.7, dated Aug. 13, 2021, 5 pages.
(Continued)

*Primary Examiner* — Giovanni Astacio-Oquendo
(74) *Attorney, Agent, or Firm* — Sage Patent Group

(57) ABSTRACT

The present invention relates to a method and monitoring device, for monitoring N number of transformer bushings operating in substantially the same environment. N being any number more than 1. The method comprises estimating an absolute value for the capacitances of each of the bushings, the absolute values for the capacitances being denoted $C_x$, and estimating an absolute value for the loss factor or the power factor of each of the bushings, the absolute values for the loss factors or the power factors being denoted $F_x$. X is a number representing which bushing the value is associated to and X larger than 1. The method further comprises calculating $\Delta$-values for all C values and $\Delta$-values for all F values, according to:

$\Delta C_X = C_X - C_{X+1}$, for all values up to, and including, $\Delta C_{N-1}$, $\Delta C_N = C_N - C_1$, for $\Delta C_N$, (Continued)

$\Delta F_X = F_X - F_{X+1}$, for all values up to, and including, $\Delta F_{N-1}$, $\Delta F_N = F_N - F_1$, for $\Delta F_N$, and determining whether the Δ-values are within predefined ranges.

20 Claims, 7 Drawing Sheets

(58) Field of Classification Search
USPC .............................. 324/547, 546, 537, 500
See application file for complete search history.

(56) References Cited

U.S. PATENT DOCUMENTS

| | | | |
|---|---|---|---|
| 10,345,366 B2 * | 7/2019 | Abeywickrama .. | G01R 31/1245 |
| 10,809,289 B2 * | 10/2020 | Abeywickrama ...... | G01R 31/64 |
| 2003/0160602 A1 | 8/2003 | Anand et al. | |
| 2013/0018620 A1 | 1/2013 | Riendeau et al. | |
| 2016/0154051 A1 * | 6/2016 | Watson ............. | G01R 31/1272 |
| | | | 324/552 |
| 2016/0252564 A1 | 9/2016 | Wu et al. | |
| 2018/0113164 A1 * | 4/2018 | Abeywickrama .. | G01R 27/2694 |
| 2020/0057103 A1 * | 2/2020 | Viereck ............. | G01R 27/2694 |
| 2023/0273269 A1 * | 8/2023 | Cheim ............. | G01R 31/1227 |
| | | | 702/58 |

FOREIGN PATENT DOCUMENTS

| | | |
|---|---|---|
| CN | 107209210 | 9/2017 |
| CN | 107430161 | 12/2017 |
| DE | 102017104110 A1 | 8/2018 |
| EP | 3206041 A1 | 8/2017 |
| JP | 2001228198 A | 8/2001 |
| JP | 2017502455 A | 1/2017 |
| JP | 2020509372 A | 3/2020 |
| JP | 2020509377 A | 3/2020 |
| JP | 2020509380 A | 3/2020 |
| JP | 7304416 B2 | 7/2023 |
| KR | 20160086847 A | 7/2016 |
| WO | 2018158135 A1 | 9/2018 |
| WO | WO 2018/158122 A1 | 9/2018 |

OTHER PUBLICATIONS

Extended European Search Report, European Patent Application No. 18205173.0, dated May 21, 2019, 5 pages.
Notice of Grounds for Rejection, Korean Patent Application No. 10-2021-7013754, dated Jun. 21, 2021, 11 pages.
Notice of Grounds of Rejection, Japanese Patent Application No. 2021-524960, dated Nov. 24, 2021, 13 pages.
International Search Report and Written Opinion for International Application No. PCT/EP2019/076746 dated Jan. 22, 2020, 10 pages.
Japanese Office Action and English Translation, Japanese Patent Application No. 2022-123332, dated Oct. 24, 2023, 8 pages.

* cited by examiner

S1
receiving measurements of terminal voltage and bushing tap current of each of the bushings

S2
estimating an absolute value for the capacitances of each of the bushings, the absolute values for the capacitances being denoted $C_x$ estimating an absolute value for the capacitances of each of the bushings of the three phases, the absolute values for the capacitances being denoted $C_1$, $C_2$, and $C_3$

S3
estimating an absolute value for the loss factor or the power factor of each of the bushings, the absolute values for the loss factors or the power factors being denoted $F_x$ estimating an absolute value for the loss factor or the power factor of each of the bushings of the three phases, the absolute values for the loss factors or the power factors being denoted $F_1$, $F_2$, and $F_3$

S4
calculating -values for all C values and $\Delta$-values for all F values, according to:
$\Delta C_x = C_x - C_{x+1}$, for all values up to, and including, $\Delta C_{N-1}$,
$\Delta C_N = C_N - C_1$, for $\Delta C_N$,
$\Delta F_x = F_x - F_{x+1}$, for all values up to, and including, $\Delta F_{N-1}$,
$\Delta F_N = F_N - F_1$, for $\Delta F_N$ calculating three $\Delta$-values for $C_1$, $C_2$, and $C_3$ and three $\Delta$-values for $F_1$, $F_2$, and $F_3$, according to:
$\Delta C_1 = C_1 - C_2$,
$\Delta C_2 = C_2 - C_3$,
$\Delta C_3 = C_3 - C_1$,
$\Delta F_1 = F_1 - F_2$,
$\Delta F_2 = F_2 - F_3$,
$\Delta F_3 = F_3 - F_1$

RELATIVE BUSHING PARAMETER METHOD TO AVOID TEMPERATURE INFLUENCE IN TRANSFORMER ABSOLUTE BUSHING PARAMETER MONITORING

CROSS REFERENCE TO RELATED APPLICATIONS

This application is a 35 U.S.C. § 371 national stage application of PCT International Application No. PCT/EP2019/076746 filed on Oct. 2, 2019, which in turns claims foreign priority to International Patent Application No. 18205173.0, filed on Nov. 8, 2018, the disclosures and content of which are incorporated by reference herein in their entirety.

TECHNICAL FIELD

The present invention relates to a method for monitoring N number of transformer bushings operating in substantially the same environment at least regarding temperature and a monitoring device for performing the monitoring.

BACKGROUND

A transformer bushing relays incoming high voltage to the windings of the transformer while providing electrical insulation. Bushing failures account for about 10-20% of transformer failures according to most recent worldwide transformer failure statistics. Therefore, there is a need for bushing monitoring so that problems can be taken care of before a transformer fails. Today, there are a number of different methods of determining bushing parameters for assessing bushing status.

A common type of transformer bushing has a center conductor with wrapped layers of insulating oil impregnated paper or other insulation material arranged within a porcelain or other body. For testing and monitoring purposes the transformer bushing often comprises a bushing test (measuring) tap. The bushing test tap is connected to one of the paper layers such that a fraction of the high voltage feeding to the center conductor becomes accessible through the bushing test tap. A bushing tap adaptor with or without an integrated bushing sensor should be connected to the bushing test tap for measuring purposes.

One technique for assessing bushing status in three phase set ups, is generally referred to as the sum-current or sum of current method, in which the bushing tap currents, from all the three phase set of bushings of a transformer, are measured and summed. As long as the vector sum is zero, it can typically be concluded that the bushings are functioning properly. If the vector sum is non-zero, it may typically be concluded that there is a bushing fault. This method is generally not temperature-dependent, because all the bushings (capacitance and loss) are affected equally by temperature variations. The sum-current method is, however, sensitive to asymmetrical system voltage fluctuations and will therefore produce false alarms.

Another technique for bushing fault determination is based on comparing two bushings on the same phase. This method is termed "reference bushing method". Even if the reference bushing method is considered to be insensitive to system voltage fluctuations, it has been shown that the monitored bushing parameters are influenced by the temperature difference between the two bushings forming part of a respective transformer due to different loading, cooling conditions, vintage, etc. A reference bushing method can be found in U.S. Publ. No.: US 2018/0113164 A1.

Another method to assess the condition of the insulator involves estimating the loss tangent and capacitance by means of comparing the voltage measured at the bushing tap adaptor with a reference voltage obtained from the same high voltage source, as described in U.S. Pat. No. 4,757,263. This method requires a separate connection to the high voltage source through for example an instrument transformer. This method is not prone to system voltage fluctuations but significantly influenced by the temperature inside the bushing. The prior art uses indirect bushing temperature measurement through the tap adaptor to compensate the temperature effect by knowing the bushing material characteristics vs temperature.

SUMMARY

It is an aim of the present invention to at least partly overcome the above problems, and to provide an improved way to monitor transformer bushings for detecting malfunctioning.

The present disclosure aims to provide a method and a device for the monitoring of transformer bushings.

This aim is achieved by the method as defined in claim 1 and the device defined in claim 13. The aim is also achieved with a computer program as defined in claim 14.

According to an embodiment of the disclosure, it comprises a method, for monitoring N number of transformer bushings operating in substantially the same environment, at least regarding temperature. N being any number more than 1. The method comprises estimating an absolute value for the capacitances of each of the bushings, the absolute values for the capacitances being denoted $C_x$ and estimating an absolute value for the loss factor or the power factor of each of the bushings, the absolute values for the loss factors or the power factors being denoted $F_x$. X is a number representing which bushing the value is associated to and X larger than 1. The method further comprises calculating Δ-values for all C values and Δ-values for all F values according to:

$$\Delta C_X = C_X - C_{X+1}, \text{ for all values up to, and including,}$$
$$\Delta C_{N-1},$$

$$\Delta C_N = C_N - C_1, \text{ for } \Delta C_N,$$

$$\Delta F_X = F_X - F_{X+1}, \text{ for all values up to, and including,}$$
$$\Delta F_{N-1},$$

$$\Delta F_N = F_N - F_1, \text{ for } \Delta F_N.$$

The method further comprises determining whether the Δ-values are within predefined ranges.

The absolute value for the loss factor or power factor being an absolute value for dielectric loss.

By performing these steps, it is possible to determine whether a bushing is deviating from normal behaviour or not. This gives the advantage that malfunctioning bushings can be replaced before they lead to transformer failure. Accordingly, costs can be reduced by simply replacing the malfunctioning bushing without replacing the whole transformer. For operation-critical transformers, it can save time by allowing planning of when the bushing should be replaced instead of the transformer failing at an unpredictable time. It should be noted that the method can be applied to monitoring any number of transformer bushings as long as they are operating in substantially the same environment when considering temperature.

A big advantage compared to prior art is that fluctuations in the values which are due to temperature changes are removed when calculating the Δ-values. Since all bushings are operating in the same environment regarding temperature, they are subjected to the same variations in temperature. When calculating the Δ-values, all value fluctuations that are the same for the bushings are removed. What is left is the difference between them which will give an indication that one of them is deviating from normal values if the difference becomes big.

According to some aspects, the number of transformer bushings is three in a three-phase set up and the steps comprises estimating an absolute value for the capacitances of each of the bushings of the three phases, the absolute values for the capacitances being denoted $C_1$, $C_2$, and $C_3$ and estimating an absolute value for the loss factor or the power factor of each of the bushings of the three phases, the absolute values for the loss factors or the power factors being denoted $F_1$, $F_2$, and $F_3$. Three Δ-values for $C_1$, $C_2$, and $C_3$ and three Δ-values for $F_1$, $F_2$, and $F_3$, are calculated according to:

$$\Delta C_1 = C_1 - C_2,$$

$$\Delta C_2 = C_2 - C_3,$$

$$\Delta C_3 = C_3 - C_1,$$

$$\Delta F_1 = F_1 - F_2,$$

$$\Delta F_2 = F_2 - F_3,$$

$$\Delta F_3 = F_3 - F_1.$$

The method is thus applicable to three-phase set ups, such as three-phase banks, i.e. three single phase transformers, and three-phase units, i.e. a single three phase unit with all three phases. The advantages are the same as for the more general method above. The method is very suitable for use in a three-phase set up since the three bushings are in the same environment.

According to some aspects, the predefined ranges comprises a first predefined range for the Δ-values for $C_X$ and a second predefined range for the Δ-values for $F_X$. The ranges are, for example, set after performing initial calculations of the Δ-values so that a reasonable range can be set depending on the actual Δ-values of the bushings and noise levels.

According to some aspects, the first predefined range is between −2% and 2% of a nominal $C_X$ value.

According to some aspects, the second predefined range is between −0.2% and 0.2% of a nominal $F_X$ value.

The range should be large enough to avoid false alarms and also to allow some fluctuations in the measurements and at the same time narrow enough so that malfunctioning bushings are detected early.

According to some aspects, the method comprises receiving measurements of terminal voltage and bushing tap current of each of the bushings. The absolute values for the capacitance $C_X$ and loss factor or power factor $F_X$ are estimated based on the respective terminal voltage and bushing tap current. This is an accurate and easy way to obtain the capacitance and loss factor or power factor of the bushings.

According to some aspects, the absolute values for the capacitance $C_X$ and loss factor or power factor $F_X$ are estimated, and the Δ-values are calculated, repeatedly and with a predetermined amount of time between each estimation/calculation. In other words, the estimation and calculation are done periodically so that the Δ-values can be plotted overtime. In other words, the $C_X$ values, the $F_X$ values and the Δ-values are obtained periodically, and the bushings are thus continuously monitored.

According to some aspects, the method comprises, when two Δ-values are outside of the predefined range, to determine which $C_X$ or $F_X$ value is present in both calculations for the two Δ-values which are outside of the predefined range to identify which bushing is associated with the deviant value. Since each value is present in two Δ-value calculations, two Δ-values will be deviating from a set standard when there is a bushing with deviating values.

According to some aspects, the method comprises setting a status of the identified bushing to deviating. The status is changed and can for example be displayed on a monitoring display. Personnel can then see that a bushing is deviating and plan for its replacement.

According to some aspects, the status of the identified bushing is set to deviating when it has been determined that the same bushing has been identified in at least two succeeding estimations/calculations. This has the advantage that a miscalculation or a faulty measurement that gives a value outside of the predetermined range does not give a false alarm.

According to some aspects, the step of determining whether the Δ-values are within a predefined range comprises to calculate a moving average of the Δ-values and determine whether the moving average is within the predefined range. This is to smoothen out the results to avoid false alarms due to outlier data.

According to an embodiment of the disclosure, it comprises a monitoring device for monitoring N number of transformer bushings operating in substantially the same environment, at least considering temperature. N being any number more than 1. The monitoring device comprises processing circuitry and a non-transitory computer-readable medium comprising computer-executable components which, when executed by the processing circuitry, causes the monitoring device to perform the steps of the method according to above.

According to an embodiment of the disclosure, it comprises a computer program comprising computer-executable components which when run on processing circuitry of a monitoring device, causes the monitoring device to perform the steps according to the method according to above.

BRIEF DESCRIPTION OF THE DRAWINGS

The invention will now be explained more closely by the description of different embodiments of the invention and with reference to the appended figures.

FIGS. 3A and 3B show a block diagram a method for monitoring bushings;

DETAILED DESCRIPTION

Figure 1:
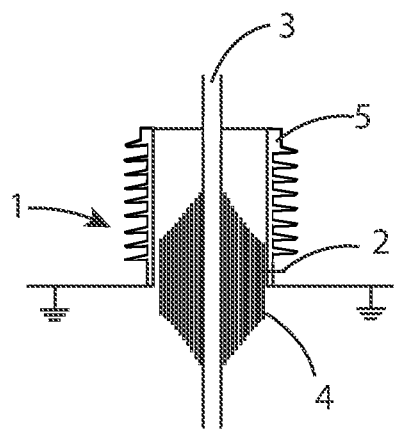
FIG. 1 shows an example of a bushing with a test tap.

Aspects of the present disclosure will be described more fully hereinafter with reference to the accompanying drawings. The device and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only and is not intended to limit the invention. As used herein, the singular forms "a", "an" and "the" are intended to include the plural forms as well, unless the context clearly indicates otherwise.

Unless otherwise defined, all terms used herein have the same meaning as commonly understood by one of ordinary skill in the art to which this disclosure belongs.

The term "bushing tap" is also known in the field as bushing measuring tap and bushing test tap. The bushing tap adaptor as mentioned in the background section is a sensor that usually contains the measuring impedance. It is also an adaptor that connects to the bushing tap and grounds the bushing tap in case no monitoring is done or connects to an external impedance (resistor/capacitor) for current measurement purpose in case of introducing monitoring. The bushing tap is, for example, a conducting pin provided by the bushing manufacturer for on/off-line measurement purposes. The conducting pin may be galvanically coupled to the outer most or the second outer most layer of a wound capacitor of a bushing.

Figure 2:
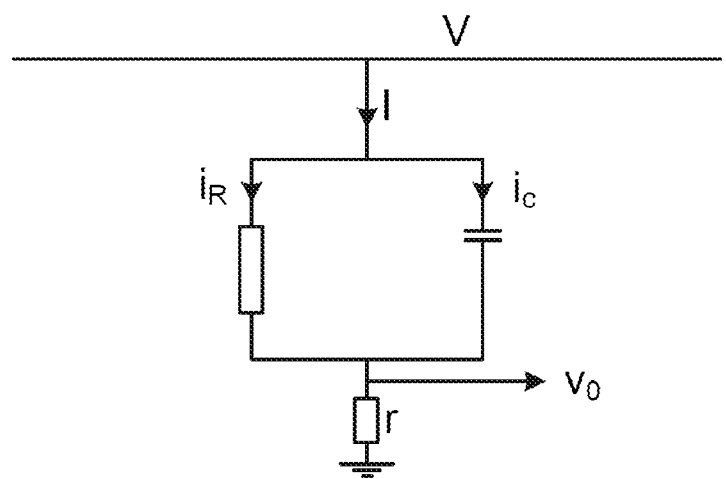
FIG. 2 shows a bushing model for obtaining capacitance values and loss-factor values of a bushing.
Figure 3B:
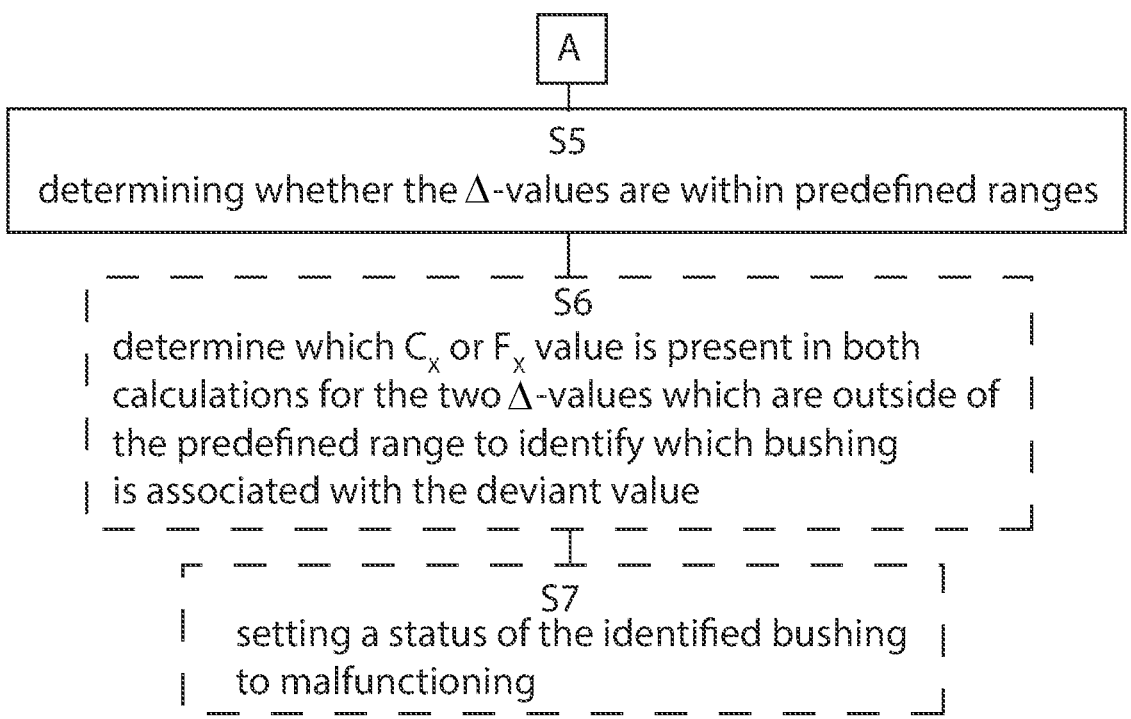

FIG. 1 shows an example of a bushing 1 with a bushing tap 2. A center conductor 3 is wrapped with multiple layers of insulating oil impregnated paper or other insulation medium like resin impregnated or resin bonded paper 4 arranged within a porcelain, or other material, body 5. FIG. 2 shows a bushing model and measuring impedance connected to the bushing tap and FIGS. 3A and 3B show a block diagram of a method for monitoring bushings. In the block diagram, the steps in solid line boxes are steps of the method according to the broadest aspects of the invention and steps in boxes with dotted lines are possible additional steps. The possible additional steps may be performed in combination with the steps according to the broadest aspects of the disclosure singly or in combination with one or more other possible additional steps.

The disclosed method is for monitoring N number of transformer bushings operating in substantially the same environment, at least regarding temperature. N being any number more than 1. As can be seen in FIGS. 3A and 3B, the method comprises estimating S2 an absolute value for the capacitances of each of the bushings, the absolute values for the capacitances being denoted $C_x$ and estimating S3 an absolute value for the loss factor or the power factor of each of the bushings, the absolute values for the loss factors or the power factors being denoted $F_x$. X is a number representing which bushing the value is associated to and X larger than 1. The method further comprises calculating S4 Δ-values for all C values and Δ-values for all F values according to:

$\Delta C_X = C_X - C_{X+1}$, for all values up to, and including, $\Delta C_{N-1}$, $\Delta C_N = C_N - C_1$, for $\Delta C_N$, $\Delta F_X = F_X - F_{X+1}$, for all values up to, and including, $\Delta F_{N-1}$, $\Delta F_N = F_N - F_1$, for $\Delta F_N$.

The method further comprises determining S5 whether the Δ-values are within predefined ranges.

The transformer bushings also operate, according to some aspects, in substantially the same environment regarding humidity and other environmental effects like rain.

One reason for an increase in the capacitance is short-circuit between capacitive layers in the bushing. One reason for change in the loss factor or power factor is moisture ingress or decomposition of oil in the bushing. These phenomena should be detected as early as possible before they grow to a dangerous level that compromises bushing health and ultimately lead to bushing failure causing collateral damages and possibly setting the transformer on fire.

One way to estimate the absolute values for the capacitances CX and the absolute values for loss factor of power factor is to use a bushing tap. Thus, according to some aspects, the method comprises receiving S1 measurements of terminal voltage and bushing tap current of each of the bushings. The absolute values for the capacitance $C_X$ and loss factor or power factor $F_X$ are estimated based on the respective terminal voltage and bushing tap current based on the bushing model shown in FIG. 2. This is an accurate and easy way to obtain the capacitance and loss factor or power factor of the bushings.

FIG. 2 shows an example bushing model which provides measurement of a bushing terminal voltage V and bushing tap current I. The bushing terminal voltage V may for example be obtained using a voltage transformer. The complex admittance Y of a bushing is equal to the bushing tap current I divided by the bushing terminal voltage, i.e. Y=I/V, and each capacitance value may be estimated by dividing the imaginary part of the complex admittance with the angular frequency of the system, i.e. C=Im(Y)/ω. The loss-factor, or tan(δ), may be estimated by dividing the real part of the complex admittance with the complex part of the complex admittance, i.e. Re(Y)/Im(Y), which is equivalent to ir/ic, i.e. tan(δ)=ir/ic. If use of the power factor is preferred before loss factor, it can be calculated by cos (90−δ).

With the above method, fluctuations in the values which are due to temperature changes, or any other common influence excreted by the environment like rain, are removed when calculating the Δ-values. Since all bushings are operating in the same environment regarding temperature, they are subjected to the same variations in temperature. When calculating the Δ-values, all value fluctuations that are the same for the bushings are removed. What is left is the difference between them which will give an indication that one of them is deviating if the difference becomes larger.

Figure 4:
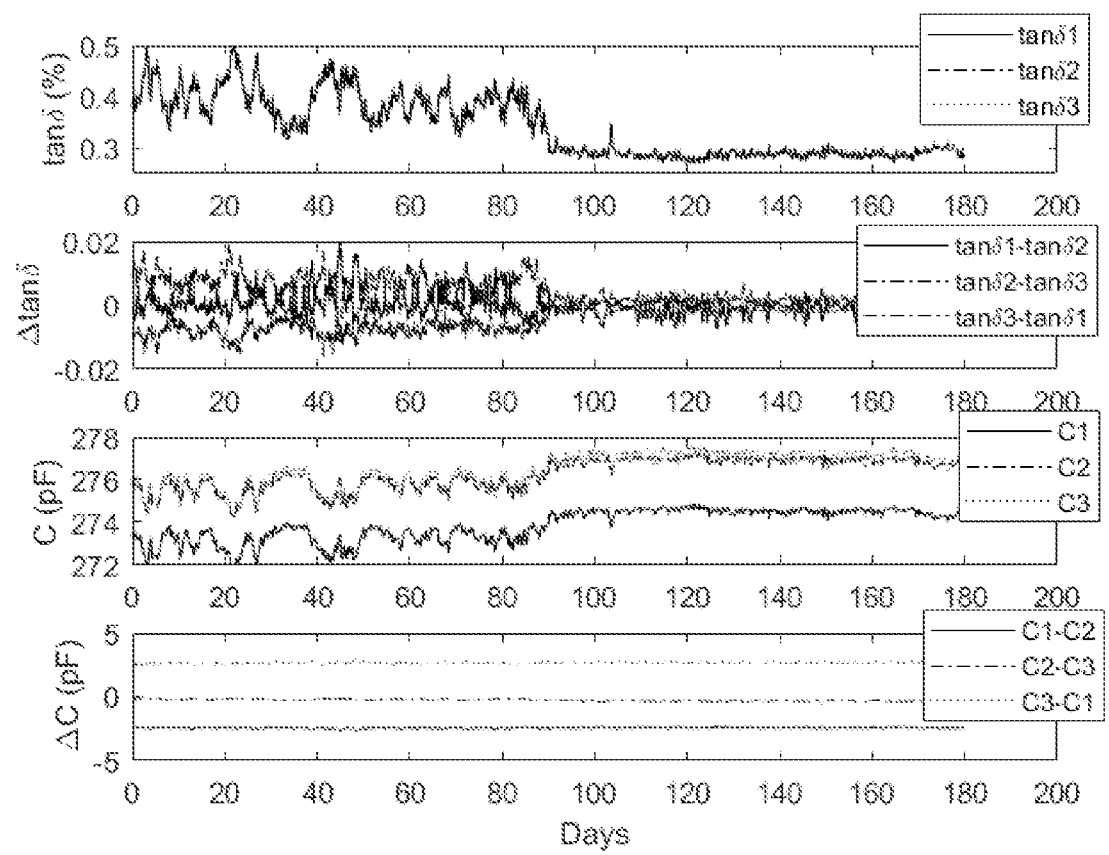
FIG. 4 shows diagrams plotting loss factor values, capacitance values and Δ-values for the same over 180 days with varying temperature.
Figure 5:
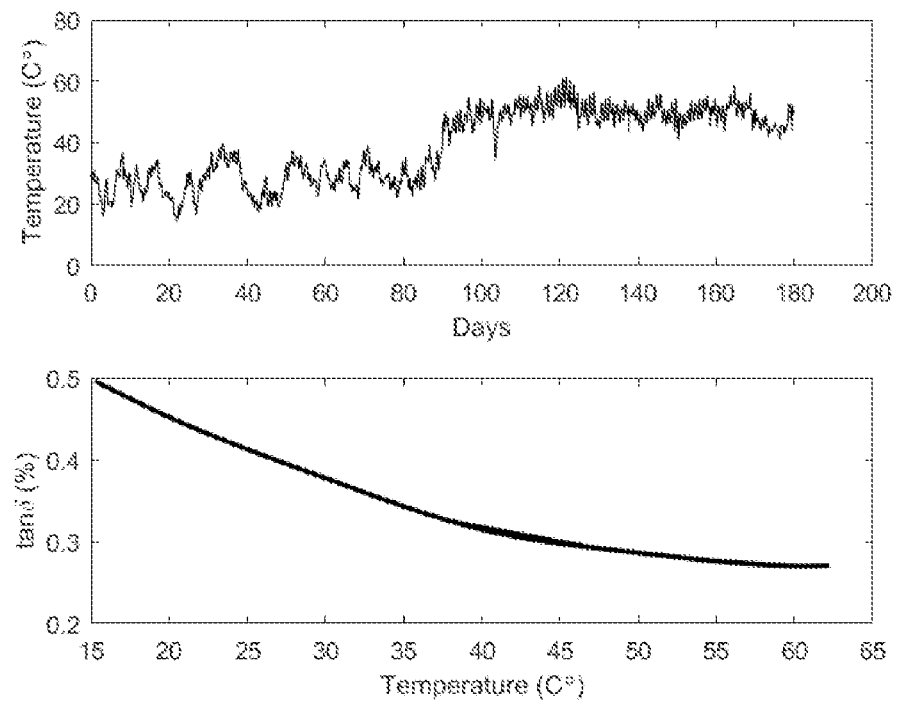
FIG. 5 shows the varying temperature over the 180 days of FIG. 4 and how the loss factor depends on the temperature.
Figure 6:
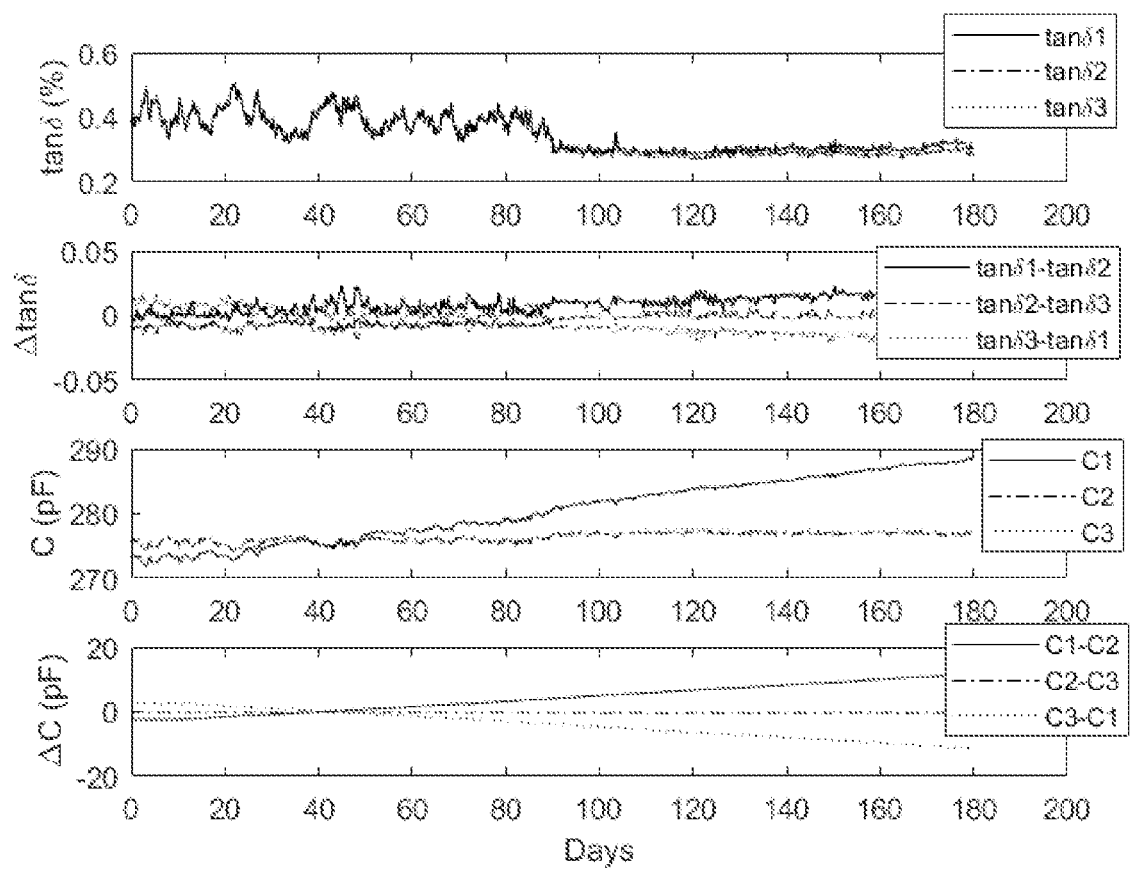
FIG. 6 shows diagrams plotting loss factor values, capacitance values and Δ-values for the same over 180 days with linearly increasing moisture between day 10 and 170. The values are simulated values.
Figure 7:
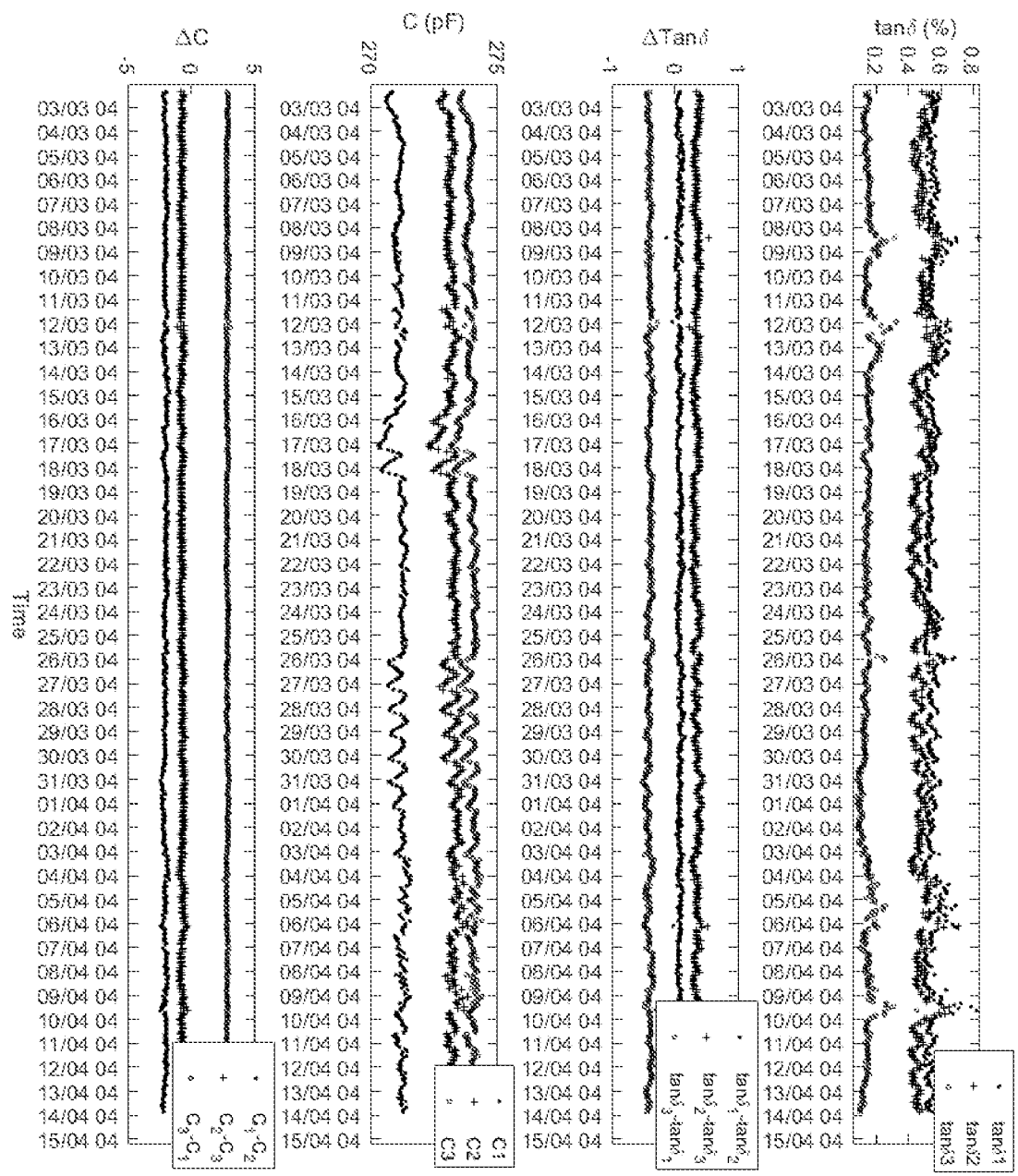
FIG. 7 shows diagrams plotting loss factor values, capacitance values and Δ-values for the same over 44 days. The values are actual values where the capacitance and loss factor have been estimated based on real measurements on a 40 MVA, 130/11 kV transformer.

In FIGS. 4, 6 and 7, graphs showing the F, C and Δ-values are shown. Note that in the graphs, loss factor has been used for F, which is denoted tan δ. The graphs are plotted over 180 days. Looking at the scales on the y-axis, it is clear that the Δ-values fluctuate much less than the estimated C and F values. For example, in FIG. 6, tan δ varies approximately between 0.25 and 0.5 whereas the Δ tan δ-value varies approximately between −0.025 and 0.025. In FIG. 6, a linear increase of moisture content of 0.2% over a 170-day period starting from 10th day was applied on bushing 1. The figures are further discussed below when discussing metric values calculations. In FIG. 5 the temperature variations over the 180 days are plotted. In the lower part of FIG. 5 it is plotted how the loss factor depends on the temperature. The figure shows one of the reasons why it is good to remove the influence of temperature when monitoring the bushings. As can be seen in the graph, the loss factor varies significantly with temperature. Not included in FIG. 5 is what happens to the loss factor when the temperature rises even higher. It is then expected that the loss factor starts to rise again.

It should be noted that the method can be applied to monitoring any number of transformer bushings as long as they are operating in substantially the same environment when considering temperature. A big advantage compared to prior art is that fluctuations in the values which are due to temperature changes are removed when calculating the Δ-values.

Since all bushings are operating in the same environment regarding temperature, they are subjected to the same variations in temperature. When calculating the Δ-values, all value fluctuations that are the same for the bushings are removed. What is left is the difference between them which will give an indication that one of them is deviating if the difference becomes big.

As an example, if the number of bushings is four, i.e. if N=4, there will be 8 estimated values after S2 and S3: $C_1$, $C_2$, $C_3$, $C_4$, $F_1$, $F_2$, $F_3$, and $F_4$. $C_1$ and $F_1$ being the capacitance and loss factor or power factor respectively for a first bushing of the four bushings. $C_2$ and $F_2$ being the capacitance and loss factor or power factor respectively for a second bushing of the four bushings. $C_3$ and $F_3$ being the capacitance and loss factor or power factor respectively for a third bushing of the four bushings. $C_4$ and $F_4$ being the capacitance and loss factor or power factor respectively for a fourth bushing of the four bushings.

The calculations of step S4 are:

$$\Delta C_1 = C_1 - C_2,$$

$$\Delta C_2 = C_2 - C_3,$$

$$\Delta C_3 = C_3 - C_4,$$

$$\Delta C_4 = C_4 - C_1$$

$$\Delta F_1 = F_1 - F_2,$$

$$\Delta F_2 = F_2 - F_3,$$

$$\Delta F_3 = F_3 - F_4,$$

$$\Delta F_4 = F_4 - F_1.$$

The method is advantageously used for three-phase set ups, such as three-phase banks, i.e. three single phase transformers, and three-phase units, i.e. a single three phase unit with all three phases. The method is very suitable for use in a three-phase set up since, generally, the three bushings in a three-phase set up are in the same environment. Thus, according to some aspects, the number of transformer bushings is three in a three-phase set up and the steps comprises estimating S2 an absolute value for the capacitances of each of the bushings of the three phases, the absolute values for the capacitances being denoted $C_1$, $C_2$, and $C_3$ and estimating S3 an absolute value for the loss factor or the power factor of each of the bushings of the three phases, the absolute values for the loss factors or the power factors being denoted $F_1$, $F_2$, and $F_3$. Three Δ-values for $C_1$, $C_2$, and $C_3$ and three Δ-values for $F_1$, $F_2$, and $F_3$, are calculated S4 according to:

$$\Delta C_1 = C_1 - C_2,$$

$$\Delta C_2 = C_2 - C_3,$$

$$\Delta C_3 = C_3 - C_1,$$

$$\Delta F_1 = F_1 - F_2,$$

$$\Delta F_2 = F_2 - F_3,$$

$$\Delta F_3 = F_3 - F_1.$$

Again, the method comprises determining S5 whether the Δ-values are within predefined ranges. The predefined ranges for the Δ-values may be set depending on the bushings used. According to some aspects, the predefined ranges comprises a first predefined range for the Δ-values for $C_X$ and a second predefined range for the Δ-values for $F_X$. The ranges are, for example, set after performing initial calculations of the Δ-values so that a reasonable range can be set depending on the actual Δ-values of the bushings. In other words, the first time the bushings are sat in operation, the actual Δ-values of the bushings may be evaluated in an initialization period, and the predefined ranges set accordingly. The ranges may also be set depending on the indicated capacitance values and loss factor or power factor from the manufacturer of the bushings. In other words, manufacturers indicate on their bushings, which capacitance values and loss factor or power factors are expected from their bushings. The ranges may be chosen based on these numbers or acceptable industrial standards on the transformer bushing monitoring.

According to some aspects, the first predefined range is between −1% and 1% of a nominal CX value.

According to some aspects, second predefined range is between −0.1% and 0.1% of a nominal FX value.

The nominal values of CX and FX being the expected values for the capacitance and the loss factor or power factor. The nominal values are either obtained from the manufacturer of the bushings or from an offline measurement performed at the installation of the monitoring system.

It may also be that the first and second predefined ranges have defined subranges. For example: the first predefined range has one part where the bushing is functioning acceptably and one part in which the bushing functions acceptably but barely. The bushing may then require monitoring where the steps of the method are performed more often; see below for a discussion regarding periodical monitoring.

The range should be large enough to avoid false alarms and also to allow some fluctuations in the measurements and at the same time narrow enough so that deviating bushings are detected early.

The absolute values for the capacitance CX and loss factor or power factor FX may be estimated, and the Δ-values may be calculated, repeatedly and with a predetermined amount of time between each estimation/calculation. In other words, the estimation and calculation are done periodically so that the Δ-values can be plotted over time. In other words, the $C_X$ values, the $F_X$ values and the Δ-values are obtained periodically, and the bushings are thus continuously monitored. Examples of the values when monitoring over time can be seen in FIGS. 4, 6 and 7. The time-period between each estimation/calculation is for example 6 hours, 3 hours, 1 hours, 30 min or 10 min. One option is to shorten the time-period if it is determined that one estimated value is close to the predetermined range limit to more closely monitor the bushings in such a case. The time-period between each estimation/calculation is not necessarily periodical. It may for example be shorter and shorter as the bushings become older and older. The time-period is up to the system designer when setting up a system with the above method for monitoring.

As an example, when the Δ-values for CX are between −1% and 1% of the nominal value of CX, the Δ-values are considered normal, when the Δ-values for CX are between −1% and −2% or 1% and 2% of the nominal value of CX, the Δ-values are considered deviating and outside of those ranges the Δ-values are considered critical. The time-period between each estimation/calculation may be shorter when there has been detected Δ-values for CX which are outside of the −1% to 1% range but within the −2% to 2% range in order to more closely monitor bushings which are deviating.

The method comprises to, according to some aspects, when two Δ-values are outside of the predefined range, determine S6 which CX or FX value is present in both calculations for the two Δ-values which are outside of the predefined range to identify which bushing is associated with the deviant value. Since each value is present in two Δ-value calculations, two Δ-values will be deviating from a set standard when there is a bushing with deviating values. In other words, it is expected that two Δ-values are determined to be outside of the predefined range at the same time.

It should be noted that in the case of monitoring two bushings, the way to determine which bushing is deviating is different. The Δ-values will be calculated according to:

$$\Delta C_1 = C_1 - C_2,$$

$$\Delta C_2 = C_2 - C_1,$$

$$\Delta F_1 = F_1 - F_2,$$

$$\Delta F_2 = F_2 - F_1.$$

Since both C values and both F values are present in both Δ-value calculations, the above method for determining which bushing is deviating does not work. Instead, in this case, if a bushing is deviating, both of the ΔC values or both of the ΔF values will deviate from the predetermined range. To determine which bushing is deviating, it will be determined which ΔC value or ΔF value is higher than the other. When using loss factor in the calculations, the estimated F will increase if the bushing is deviating. When using power factor in the calculations, the estimated F will experience the same effect if the bushing is deviating. Furthermore, it is expected that the capacitance value C will decrease for a deviating bushing.

The method may also comprise setting S7 a status of the identified bushing to deviating. In this case, a deviating status does not necessarily mean that the bushing is broken, it means that the monitoring system has detected an incipient condition that may potentially grow into a severe level leading to malfunctioning. The status is changed and can for example be displayed on a monitoring display. Personnel can then see that a bushing is indicated as deviating and plan for its replacement. Depending on how the monitoring system for using the monitoring method is set up, there may be several ways to indicate that a bushing is deviating. There may for example be a warning light which is monitored by personal that lights up when detecting a deviating value. There may also be an alarm that sounds. If a ΔC value suddenly changes drastically, for example by a capacitive layer short-circuit type fault, there might be a risk of the bushing exploding within hours after detection. In such a case, a sounding alarm, preferably in combination with a warning message to an operator on a display, may be used to quickly inform the operator of the risk.

To avoid false alarms, the status of the identified bushing may be set S7 to deviating when it has been determined S6 that the same bushing has been identified in at least two succeeding estimations/calculations. This has the advantage that a miscalculation or a faulty measurement that gives a value outside of the predetermined range does not give a false alarm. For the loss factor or the power factor, a problem with moisture will slowly increase the F value of the bushing. In other words, a single calculation over the predefined value is very unlikely.

According to some aspects, the step of determining, S5, whether the Δ-values are within a predefined range, comprises to calculate a moving average of the Δ-values and determine whether the moving average is within the predefined range. This is to smoothen out the results to avoid false alarms due to temporary faults. In other words, a metric value can be defined for each relative capacitance and loss factor as given below based on exponential moving average and an initial mean value:

$$\text{Metric} = \frac{|Y_{exp,n} - \bar{Y}|}{\sigma} \qquad (10)$$

Where the metric is calculated for each $Y \in \{\Delta C_X, \Delta \tan \delta_X\}$, and $$Y_{exp,n} = \frac{(P-1) \times Y_{exp,(n-1)} + Y_n}{P} \qquad (20)$$

is the exponential moving average of Y at $n^{th}$ data point, $Y_{exp,n-1}$ is the exponential moving average at $(n-1)^{th}$ data point and $Y_n$ is the parameter value at $n^{th}$ data point. P is a number of data points that decides how fast the moving average respond to a change. The higher the P, the lower the fluctuation of exponential moving average of a parameter and less vulnerable to the outliers as well.

$\hat{Y}$ is the uniform average or mean of parameter Y over a predefined number of data ($P_0$) since the beginning of the installation, which is $$\bar{Y} = \frac{1}{P_0} \Sigma_{i=1}^{P_0} Y_i,$$

$i = 1 \ldots P_0$.

σ is the joint standard deviation $\sigma_{ini}$ of Y and exponential moving average ($\sigma_{exp,n}$ at $n^{th}$ operation), which is calculated based on the expressions in (30):

$$\sigma = \sqrt{\sigma_{exp,n}^2 + \sigma_{ini}^2} \qquad (30)$$

where, $$\sigma_{ini} = \sqrt{\frac{\Sigma_{i=1}^{P_0}(Y_i - \bar{Y})^2}{P_0}}$$

-continued $$\sigma_{exp,n} = \sqrt{\frac{(Y_n - Y_{exp,(n-1)})^2 - \sigma^2_{exp,(n-1)}}{P} + \sigma^2_{exp,(n-1)}}$$

The metric value in (10) indicates how much the deviation of exponential moving average with respect to the initial average in number of standard deviations (a in (30)). A tolerance limit can be set on the metric values, above which an alarm can be generated, or a bushing indication set to deviating.

As described above, there is no need for temperature measurement or compensation, since ΔC values and Δ tan δ values as described above is not prone to the temperature effect and provide the possibility to apply much sensitive trigger levels to detect developing faults much earlier, e.g., trigger levels of 4-5 standard deviations for C and 6-7 standard deviations for tan δ.

Figure 8:
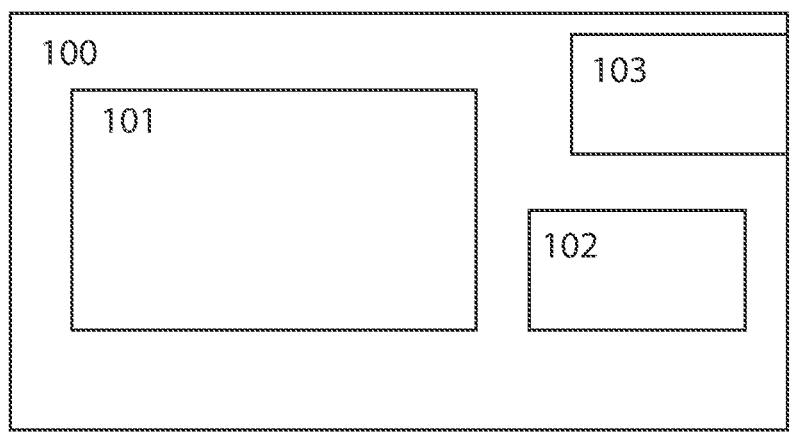
FIG. 8 is a schematically illustrated example monitoring device.

For performing the above method, a monitoring device 100 may be used. In FIG. 8, an example monitoring device 100 is illustrated schematically. The disclosure comprises a monitoring device 100 for monitoring N number of transformer bushings operating in substantially the same environment, at least considering temperature. N being any number more than 1. The monitoring device comprises processing circuitry 101 and a non-transitory computer-readable medium 102 comprising computer-executable components which, when executed by the processing circuitry 101, causes the monitoring device 1 to perform the steps of the method according to above.

The monitoring device 100 thus performs the following:
estimates (S2) the absolute value for the capacitances of each of the bushings,
estimates (S3) the absolute value for the loss factor or the power factor of each of the bushings,
calculates (S4) the Δ-values according to:

$\Delta C_X = C_X - C_{X+1}$, for all values up to, and including, $\Delta C_{N-1}$, $\Delta C_N = C_N - C_1$, for $\Delta C_N$, $\Delta F_X = F_X - F_{X+1}$, for all values up to, and including, $\Delta F_{N-1}$, $\Delta F_N = F_N - F_1$, for $\Delta F_N$, and
determines (S5) whether the Δ-values are within predefined ranges.

The monitoring device also, optionally, performs one or more, in any combination, of the following steps:
receives (S1) measurements of terminal voltage and bushing tap current of each of the bushings,
determines (S6) which $C_X$ or $F_X$ value is present in both calculations for the two Δ-values which are outside of the predefined range to identify which bushing is associated with the deviant value,
sets (S7) a status of the identified bushing to deviating, communicates the status to an operator.

The monitoring device 100 comprises input circuitry 103 for receiving the measurements. The input circuitry may be any kind of circuitry capable of receiving measurement signals.

Furthermore, the disclosure comprises a computer program comprising computer-executable components which when run on the processing circuitry 101 of the monitoring device 100, causes the monitoring device 100 to perform the steps according to above.

The invention claimed is:

1. A method, for monitoring N number of transformer bushings operating in substantially the same environment at least regarding temperature, N being any number more than 1, the method comprises:
estimating an absolute value for the capacitances of each of the bushings, the absolute values for the capacitances being denoted $C_x$,
estimating an absolute value for the loss factor or the power factor of each of the bushings, the absolute values for the loss factors or the power factors being denoted $F_x$,
wherein estimating the absolute value for the capacitances and the absolute value for the loss factor or the power factor of each of the bushings includes obtaining measurements of a terminal voltage and a bushing tap current of each of the bushings using a voltage transformer,
wherein X is a number representing which bushing the value is associated to and X larger than 1,
calculating Δ-values for all C values and Δ-values for all F values, according to:

$\Delta C_X = C_X - C_{X+1}$, for all values up to, and including, $\Delta C_{N-1}$, $\Delta C_N = C_N - C_1$, for $\Delta C_N$, $\Delta F_X = F_X - F_{X+1}$, for all values up to, and including, $\Delta F_{N-1}$, $\Delta F_N = F_N - F_1$, for $\Delta F_N$, and determining whether the Δ-values are within predefined ranges.

2. The method according to claim 1, wherein the number of transformer bushings is three in a three-phase set up, wherein:
estimating the absolute value for the capacitances of each of the bushings comprises estimating an absolute value for the capacitances of each of the bushings of the three phases, the absolute values for the capacitances being denoted $C_1$, $C_2$, and $C_3$,
estimating the absolute value for the loss factor or the power factor of each of the bushings comprises estimating an absolute value for the loss factor or the power factor of each of the bushings of the three phases, the absolute values for the loss factors or the power factors being denoted $F_1$, $F_2$, and $F_3$, and
calculating Δ-values for all C values and Δ-values for all F values comprises calculating three Δ-values for $C_1$, $C_2$, and $C_3$ and three Δ-values for $F_1$, $F_2$, and $F_3$, according to:

$\Delta C_1 = C_1 - C_2$, $\Delta C_2 = C_2 - C_3$, $\Delta C_3 = C_3 - C_4$, $\Delta C_4 = C_4 - C_1$, $\Delta F_1 = F_1 - F_2$, $\Delta F_2 = F_2 - F_3$, $\Delta F_3 = F_3 - F_4$, $\Delta F_4 = F_4 - F_1$.

3. The method according to claim 2, wherein the first predefined range is between −2% and 2% of a nominal $C_X$ value.

4. The method according to claim 2, wherein the second predefined range is between −0.2% and 0.2% of a nominal $F_X$ value.

5. The method according to claim 1, wherein the predefined ranges comprise a first predefined range for the Δ-values for $C_X$ and a second predefined range for the Δ-values for $F_X$.

6. The method according to claim 1,
wherein the absolute values for the capacitance $C_X$ and loss factor or power factor $F_X$ are estimated based on the respective terminal voltage and bushing tap current.

7. The method according to claim 1, wherein the absolute values for the capacitance $C_X$ and loss factor or power factor $F_X$ are estimated, and the Δ-values are calculated, repeatedly and with a predetermined amount of time between each estimation/calculation.

8. The method according to claim 7, wherein the step of determining whether the Δ-values are within a predefined range comprises calculating a moving average of the Δ-values and determining whether the moving average is within the predefined range.

9. The monitoring device according to claim 7, wherein the non-transitory computer-readable medium comprises further computer-executable instructions, which, when executed cause the monitoring device to determine whether the Δ-values are within predefined ranges by calculating a moving average of the Δ-values and determining whether the moving average of the Δ-values are within the predefined ranges.

10. The method according to claim 1, further comprising, when two Δ-values are outside of the predefined range:
determine which $C_X$ or $F_X$ value is present in both calculations for the two Δ-values which are outside of the predefined range to identify which bushing is associated with the deviant value.

11. The method according to claim 10, further comprising:
setting a status of the identified bushing to deviating.

12. The method according to claim 11, wherein the status of the identified bushing is set to deviating when it has been determined that the same bushing has been identified in at least two succeeding estimations/calculations.

13. A monitoring device for monitoring N number of transformer bushings operating in substantially the same environment at least regarding temperature, N being any number more than 1, wherein the monitoring device comprises:
processing circuitry, and
a non-transitory computer-readable medium comprising computer-executable instructions which, when executed by the processing circuitry, causes the monitoring device to:
estimate an absolute value for the capacitances of each of the bushings, the absolute values for the capacitances being denoted $C_x$,
estimate an absolute value for the loss factor or the power factor of each of the bushings, the absolute values for the loss factors or the power factors being denoted $F_x$,
wherein the estimated absolute value for the capacitances and the estimated absolute value for the loss factor or the power factor of each of the bushings are obtained via measurements of a terminal voltage and a bushing tap current of each of the bushings using a voltage transformer,
wherein X is a number representing which bushing the value is associated to and X larger than 1,
calculate Δ-values for all C values and Δ-values for all F values, according to:

$\Delta C_X = C_X - C_{X+1}$, for all values up to, and including, $\Delta C_{N-1}$, $\Delta C_N = C_N - C_1$, for $\Delta C_N$, $\Delta F_X = F_X - F_{X+1}$, for all values up to, and including, $\Delta F_{N-1}$, $\Delta F_N = F_N - F_1$, for $\Delta F_N$, and determine whether the Δ-values are within predefined ranges.

14. The monitoring device according to claim 13, wherein the number of transformer bushings is three in a three-phase set up, and wherein the non-transitory computer-readable medium comprises further computer-executable instructions, which, when executed cause the monitoring device to:
estimate the absolute value for the capacitances of each of the bushings by estimating an absolute value for the capacitances of each of the bushings of the three phases, the absolute values for the capacitances being denoted $C_1$, $C_2$, and $C_3$,
estimate the absolute value for the loss factor or the power factor of each of the bushings by estimating an absolute value for the loss factor or the power factor of each of the bushings of the three phases, the absolute values for the loss factors or the power factors being denoted $F_1$, $F_2$, and $F_3$, and
calculate Δ-values for all C values and Δ-values for all F values by calculating three Δ-values for $C_1$, $C_2$, and $C_3$ and three Δ-values for $F_1$, $F_2$, and $F_3$, according to:

$\Delta C_1 = C_1 - C_2$, $\Delta C_2 = C_2 - C_3$, $\Delta C_3 = C_3 - C_4$, $\Delta C_4 = C_4 - C_1$, $\Delta F_1 = F_1 - F_2$, $\Delta F_2 = F_2 - F_3$, $\Delta F_3 = F_3 - F_4$, $\Delta F_4 = F_4 - F_1$.

15. The monitoring device according to claim 13, wherein the predefined ranges comprise a first predefined range for the Δ-values for $C_X$ and a second predefined range for the Δ-values for $F_X$.

16. The monitoring device according to claim 15, wherein the first predefined range is between −2% and 2% of a nominal $C_X$ value and the second predefined range is between −0.2% and 0.2% of a nominal $F_X$ value.

17. The monitoring device according to claim 13,
wherein the absolute values for the capacitance $C_X$ and loss factor or power factor $F_X$ are estimated based on the respective terminal voltage and bushing tap current.

18. The monitoring device according to claim 13, wherein the non-transitory computer-readable medium comprises further computer-executable instructions, which, when executed cause the monitoring device to estimate the absolute values for the capacitance $C_X$ and loss factor or power factor $F_X$ and calculate the Δ-values, repeatedly and with a predetermined amount of time between each estimation/calculation.

19. The monitoring device according to claim 13 wherein the non-transitory computer-readable medium comprises further computer-executable instructions, which, when executed cause the monitoring device to, when two Δ-values are outside of the predefined range:
  determine which $C_x$ or $F_x$ value is present in both calculations for the two Δ-values which are outside of the predefined range to identify which bushing is associated with the deviant value.

20. The monitoring device according to claim 13, wherein the non-transitory computer-readable medium comprises further computer-executable instructions, which, when executed cause the monitoring device to:
  set a status of the identified bushing to deviating when it has been determined that the same bushing has been identified in at least two succeeding estimations/calculations.

\* \* \* \* \*